(12) United States Patent
Hsu et al.

(10) Patent No.: US 6,717,206 B2
(45) Date of Patent: Apr. 6, 2004

(54) STRUCTURE OF AN EMBEDDED CHANNEL WRITE/ERASE FLASH MEMORY CELL AND FABRICATING METHOD THEREOF

(75) Inventors: Ching-Hsiang Hsu, Hsin-Chu (TW); Ching-Sung Yang, Chang-Hua Hsien (TW)

(73) Assignee: eMemory Technology Inc., Hsin-Chu (TW)

(*) Notice: Subject to any disclaimer, the term of this patent is extended or adjusted under 35 U.S.C. 154(b) by 0 days.

(21) Appl. No.: 10/064,409

(22) Filed: Jul. 11, 2002

(65) Prior Publication Data
US 2002/0190308 A1 Dec. 19, 2002

Related U.S. Application Data

(62) Division of application No. 09/865,432, filed on May 29, 2001.

(51) Int. Cl.$^7$ .............................................. H01L 29/788
(52) U.S. Cl. ...................................... 257/316; 257/500
(58) Field of Search ................................ 438/257–267; 215/315–325

(56) References Cited

U.S. PATENT DOCUMENTS

| 5,352,620 A | * | 10/1994 | Komori et al. | 438/258 |
| 5,409,854 A | * | 4/1995 | Bergemont | 438/264 |
| 6,060,360 A | * | 5/2000 | Lin et al. | 438/264 |
| 6,107,659 A | * | 8/2000 | Onakado et al. | 257/318 |
| 6,506,647 B2 | * | 1/2003 | Kuroda et al. | 438/275 |

* cited by examiner

Primary Examiner—Richard A. Booth
(74) Attorney, Agent, or Firm—Winston Hsu

(57) ABSTRACT

The present invention relates to a structure of an embedded channel write/erase flash memory cell and a fabricating method thereof and, more particularly, to a structure combining CMOS devices and flash memory cells, wherein flash memory cell structures and CMOS devices are simultaneously fabricated on a substrate to reduce the cost and to simplify the process flow. Moreover, CMOS devices capable of performing high-voltage and low-voltage operations are reserved. Therefore, the present invention can not only effectively improve the operating efficiency of flash memory cells and CMOS devices, but its whole volume is also smaller than that obtained by combining separately designed and fabricated CMOS devices and flash memory cells.

13 Claims, 27 Drawing Sheets

STRUCTURE OF AN EMBEDDED CHANNEL WRITE/ERASE FLASH MEMORY CELL AND FABRICATING METHOD THEREOF

CROSS REFERENCE TO RELATED APPLICATIONS

This application is a division of application Ser. No. 09/865,432 filed on May 29, 2001.

BACKGROUND OF INVENTION

The present invention relates to a structure of an embedded channel write/erase flash memory cell and a fabricating method thereof and, more particularly, to a structure combining CMOS devices and flash memory cells, which can not only effectively improve the operating efficiency of flash memory cell and CMOS device, but its whole volume is also smaller than that obtained by combining separately designed and fabricated CMOS devices and flash memory cells.

Generally, flash memories and CMOS logical circuits are separately designed and fabricated. Although designers can select and match them according to required circuit designs, the volumes after integrated are unsatisfactorily larger for present demands. Nowadays, most products have been standardized, and mutual collocations of most products have specific modes. Therefore, if an IC combining flash memories and CMOS logical circuits is designed according to most of the specifications, the occupied space can be effectively reduced. Accordingly, the present invention aims to propose a structure of an embedded channel write/erase flash memory cell and a fabricating method thereof, which can not only effectively improve the operating efficiency of flash memory cells and CMOS devices, but its whole volume is also smaller than that obtained by combining separately designed and fabricated CMOS devices and flash memory cells.

SUMMARY OF INVENTION

The primary object of the present invention is to provide a structure of an embedded channel write/erase flash memory cell and a fabricating method thereof, wherein flash memory cell structures and CMOS logical devices are simultaneously fabricated on a substrate so that the flash memory cell structures and the CMOS logical devices can be combined and the whole occupied space can be reduced.

The secondary object of the present invention is to provide a structure of an embedded channel write/erase flash memory cell and a fabricating method thereof, wherein CMOS devices capable of performing high-voltage and low-voltage operations are reserved, hence effectively enhancing the whole operating efficiency.

The various objects and advantages of the present invention will be more readily understood from the following detailed description when read in conjunction with the appended drawings, in which:

DETAILED DESCRIPTION

Figure 1A:
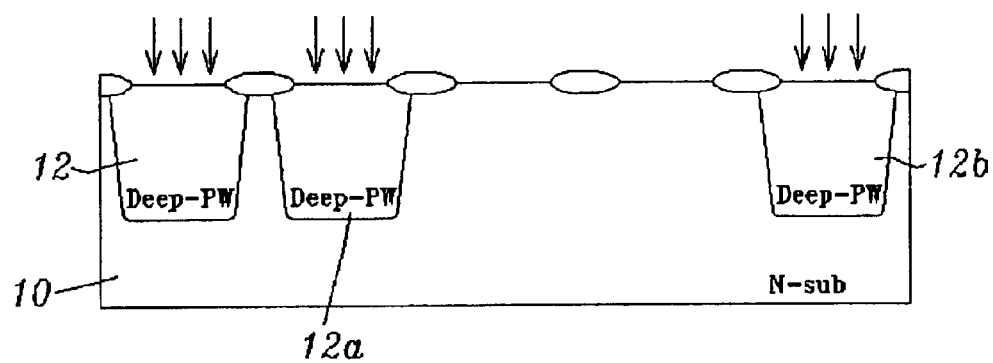
FIG. 1 is a cross-sectional view showing the process flow according to a preferred embodiment of the present invention.
Figure 1B:
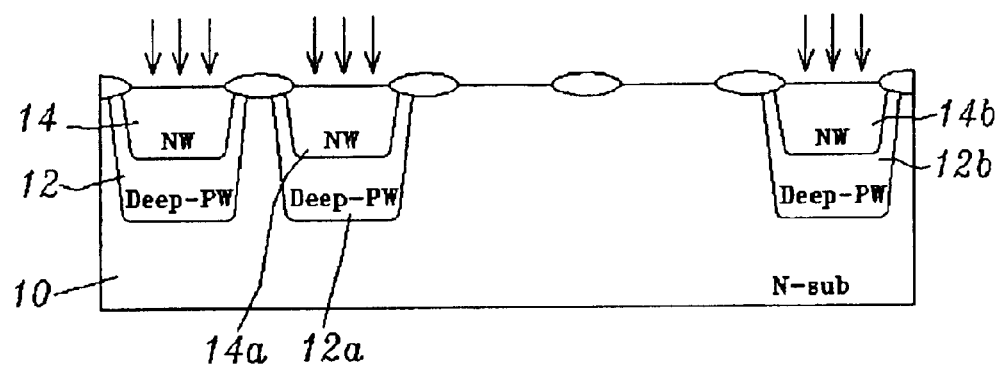
Figure 1C:
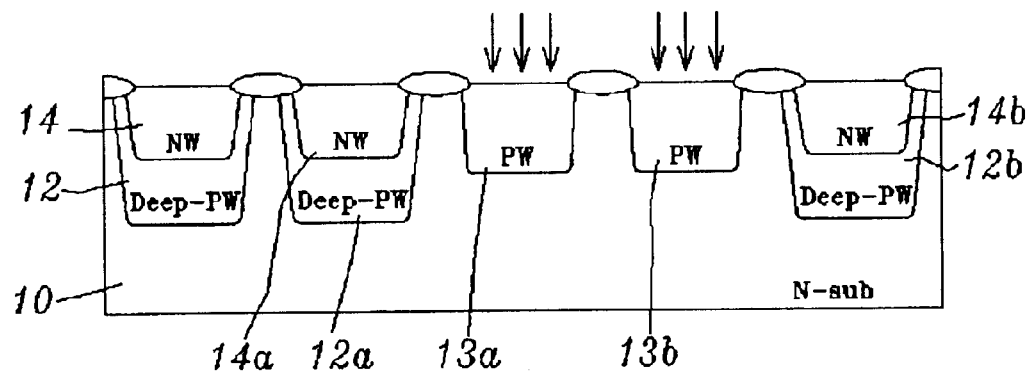
Figure 1D:
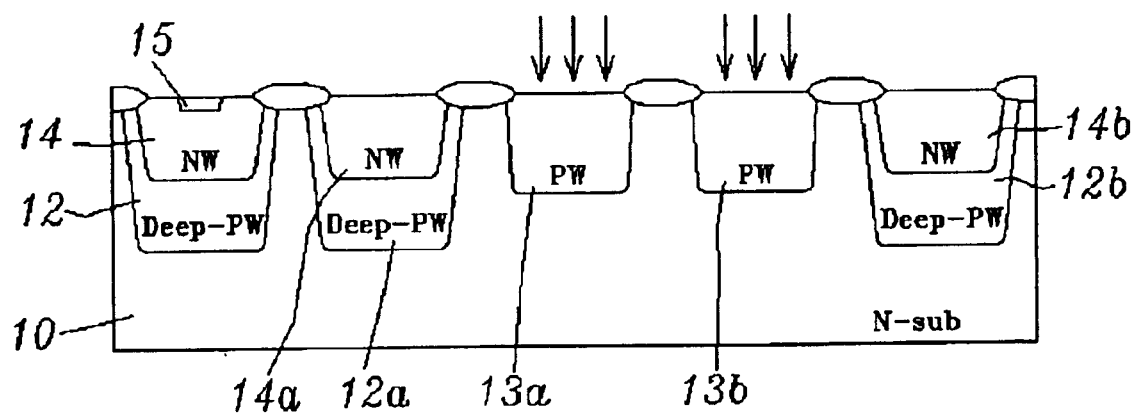
Figure 1E:
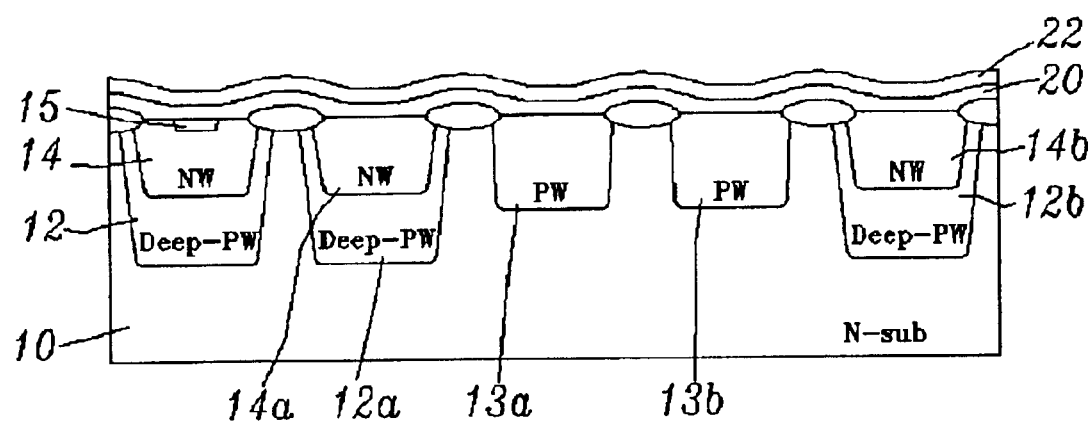
Figure 1F:
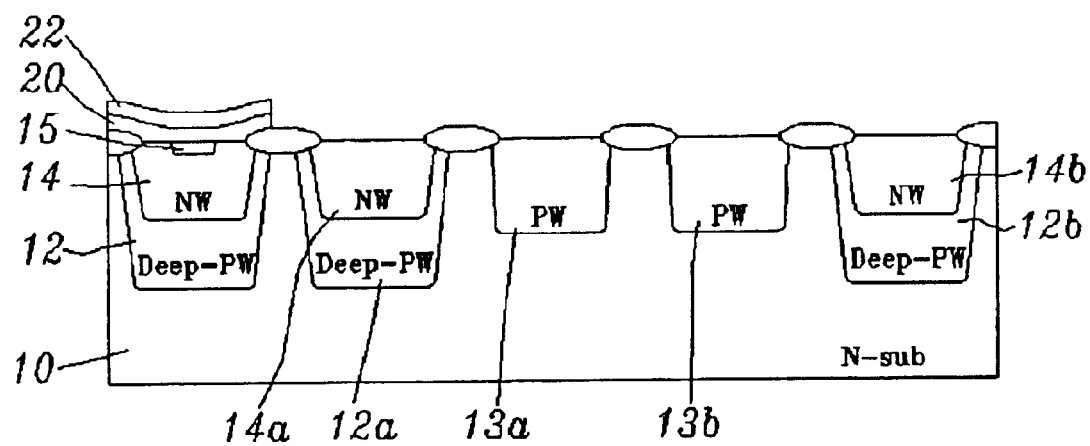
Figure 1G:
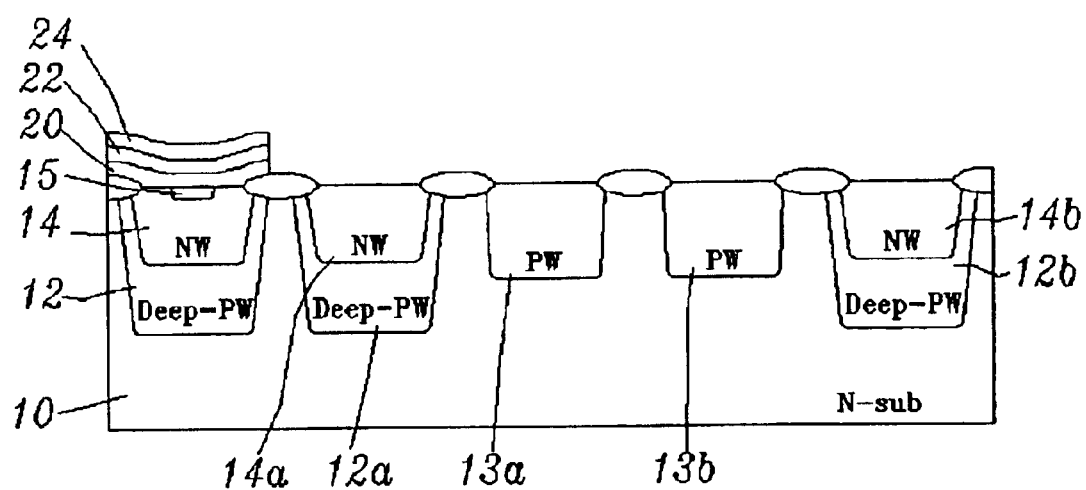
Figure 1H:
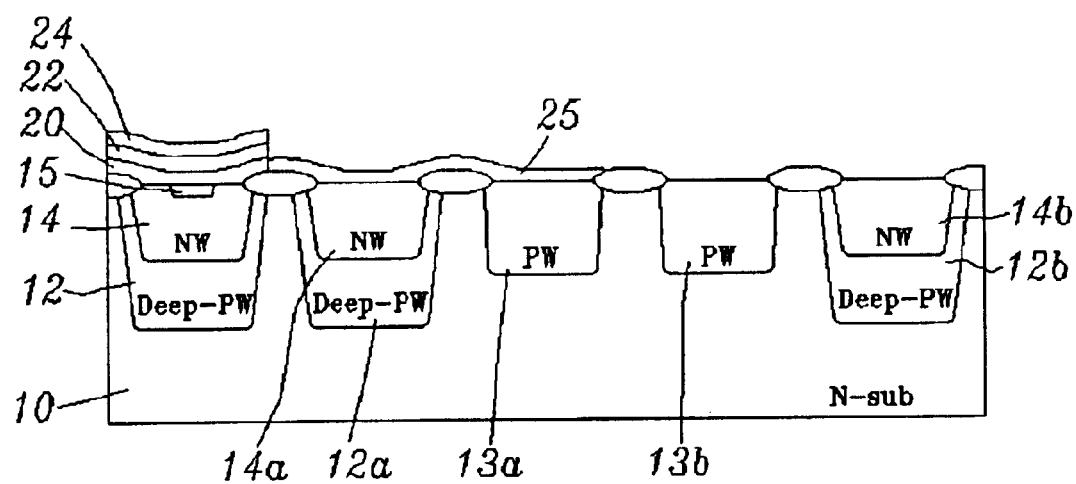
Figure 1I:
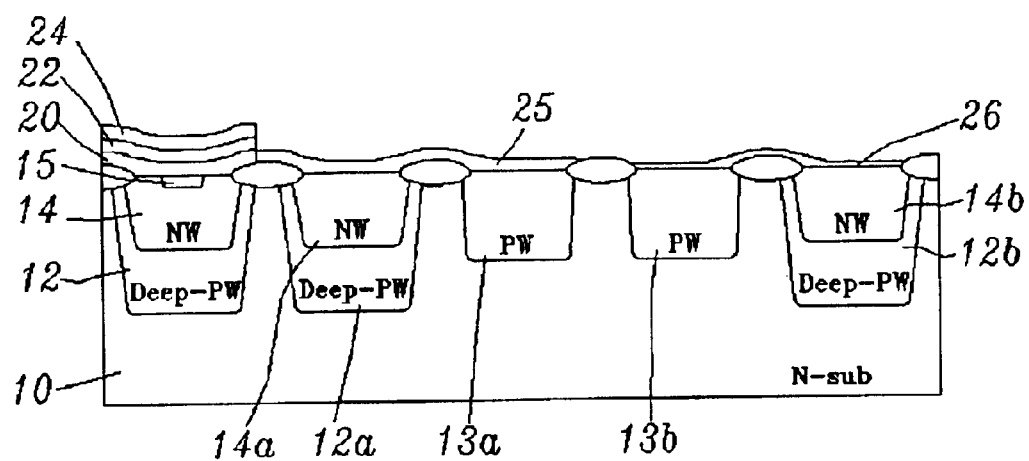
Figure 1J:
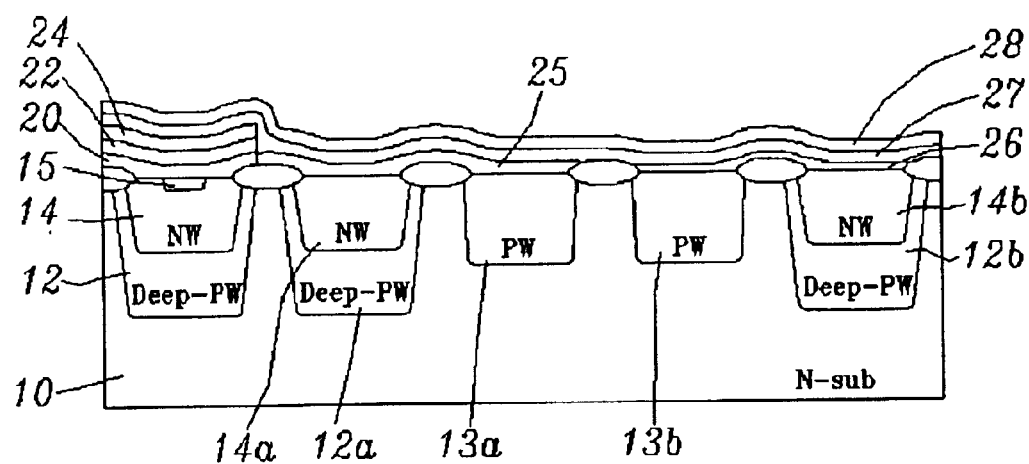
Figure 1K:
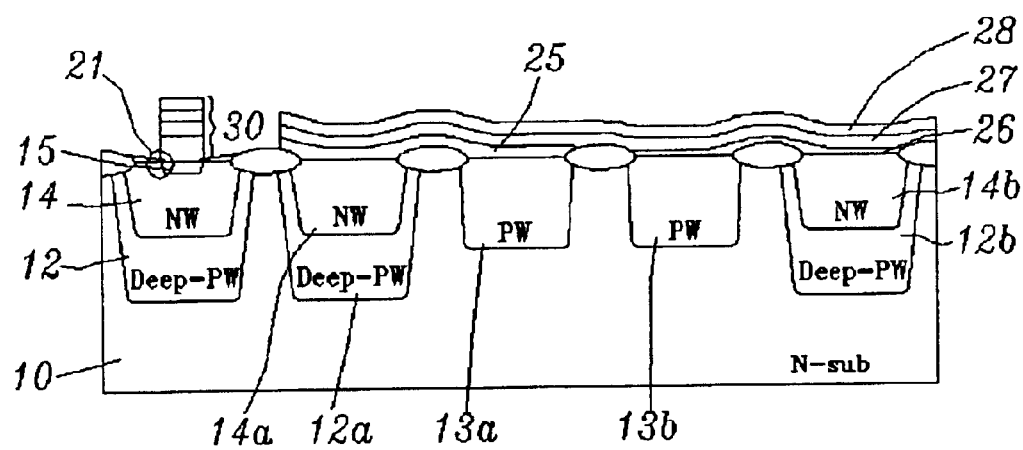
Figure 1L:
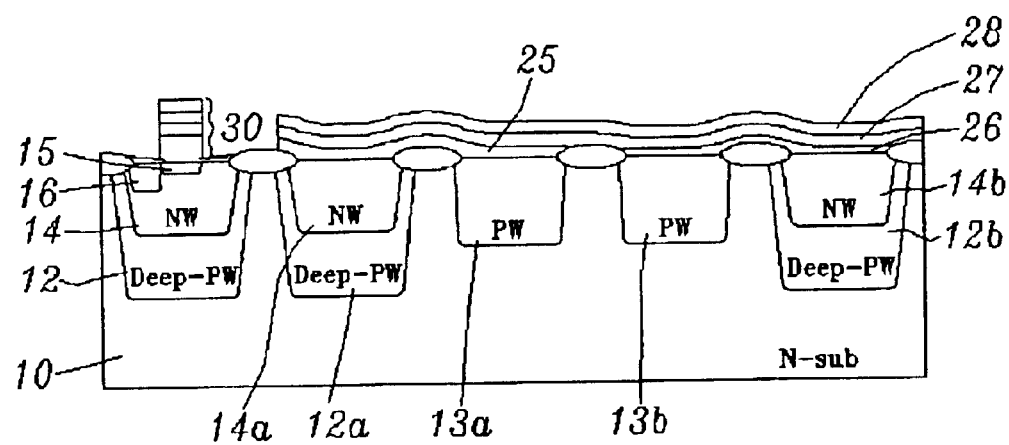
Figure 1M:
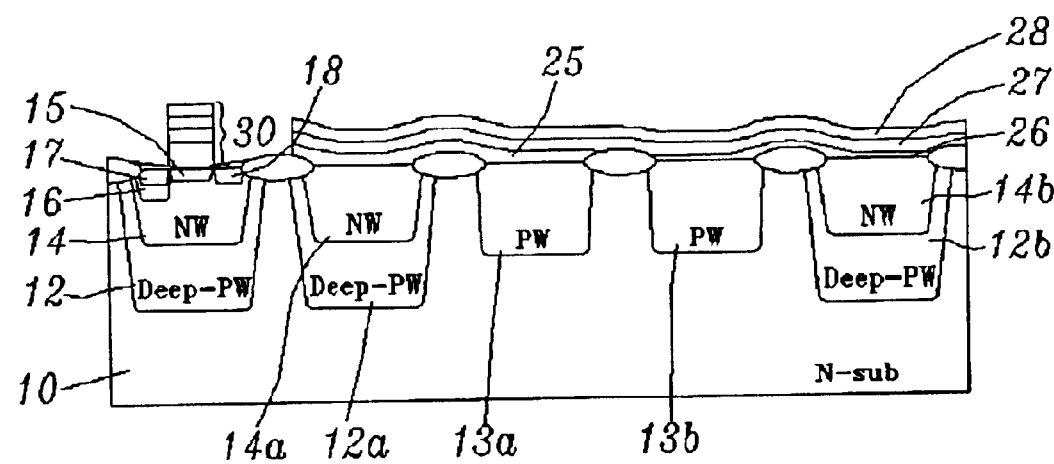
Figure 1N:
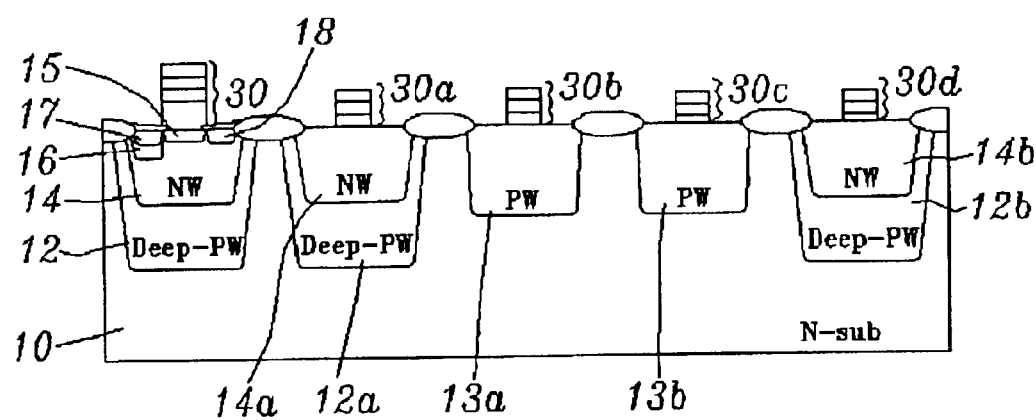
Figure 10:
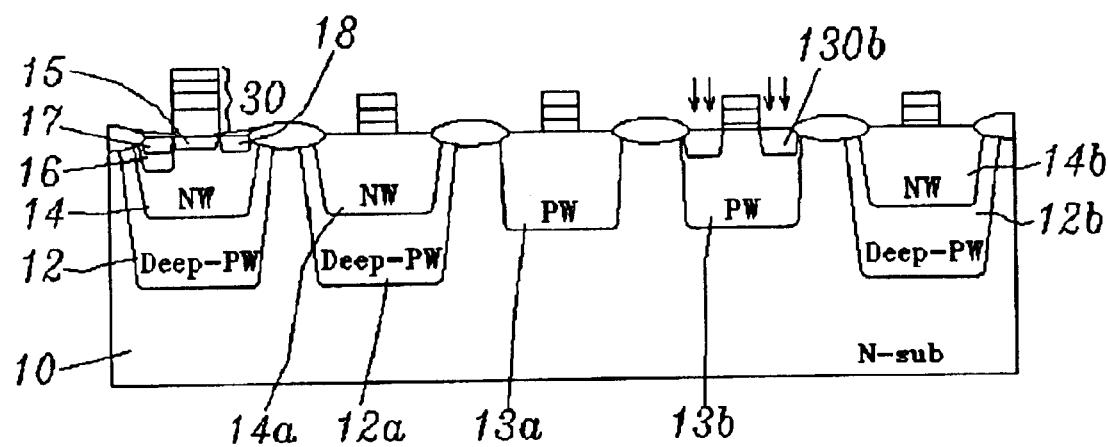
Figure 1P:
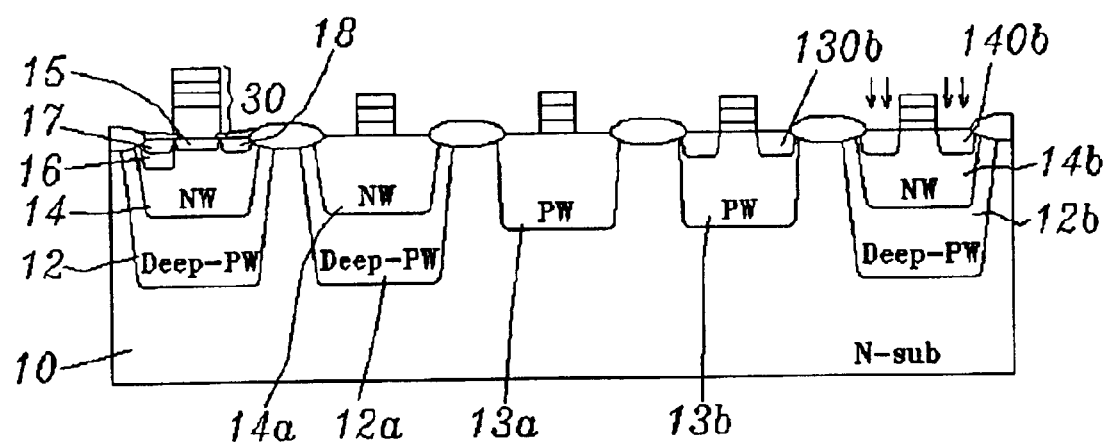
Figure 1Q:
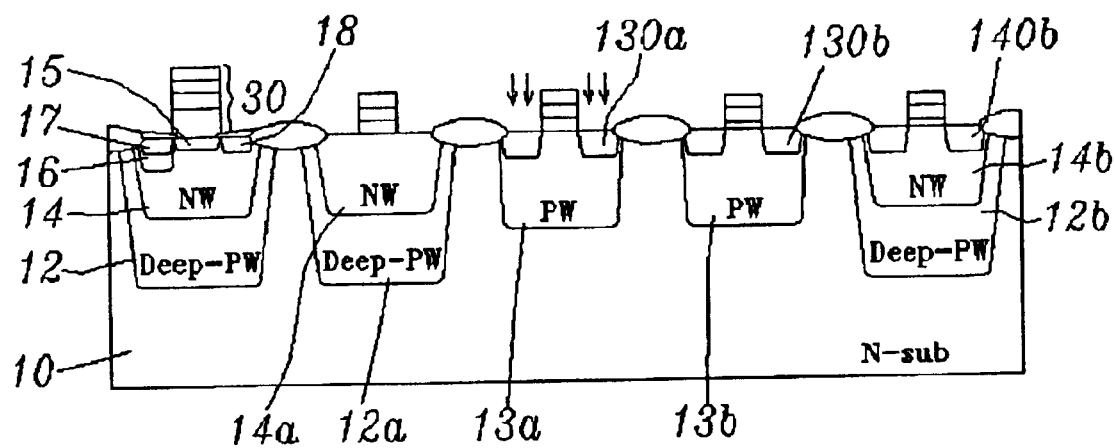
Figure 1R:
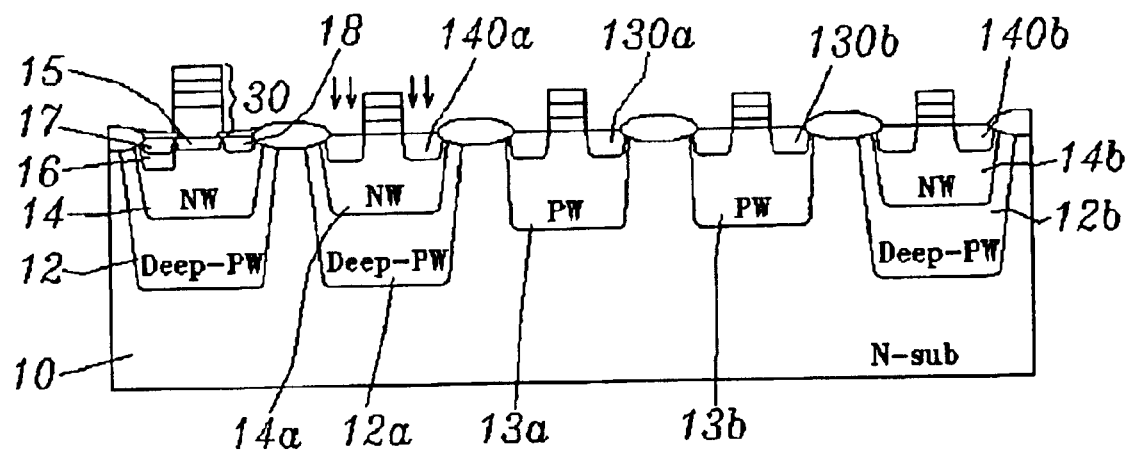
Figure 1S:
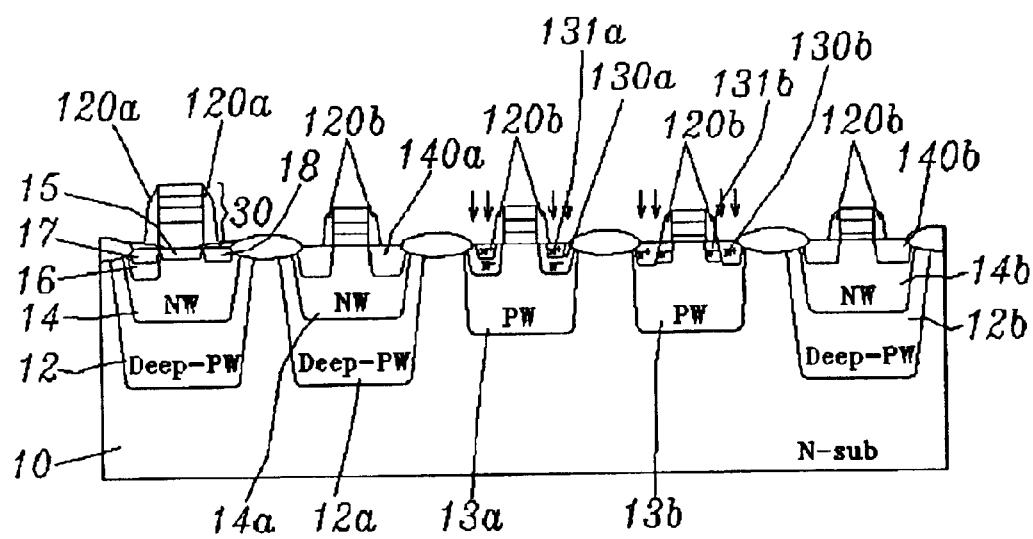
Figure 1T:
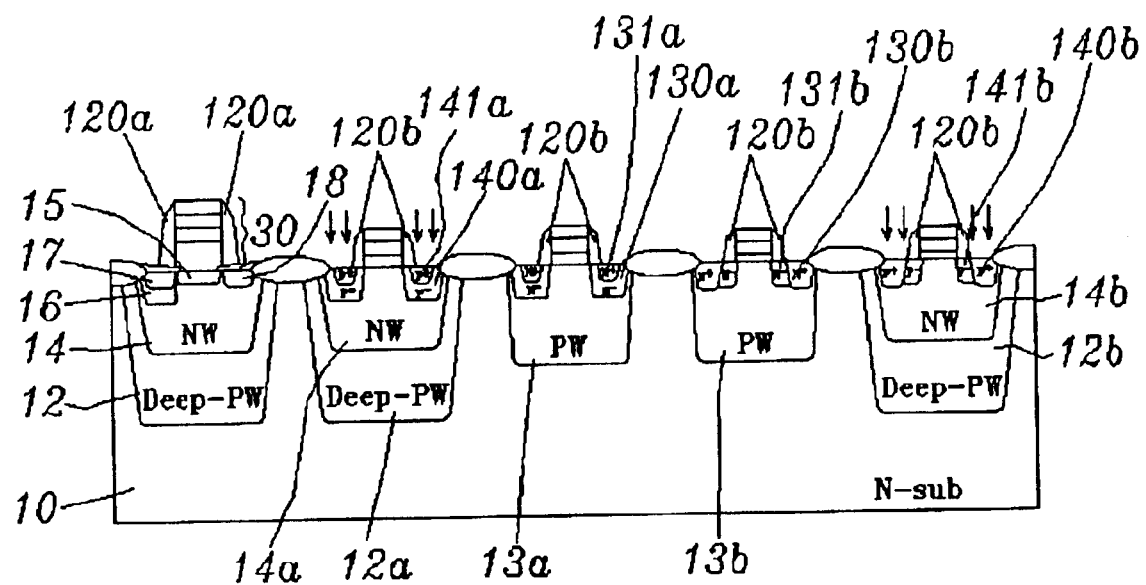
Figure 1U:
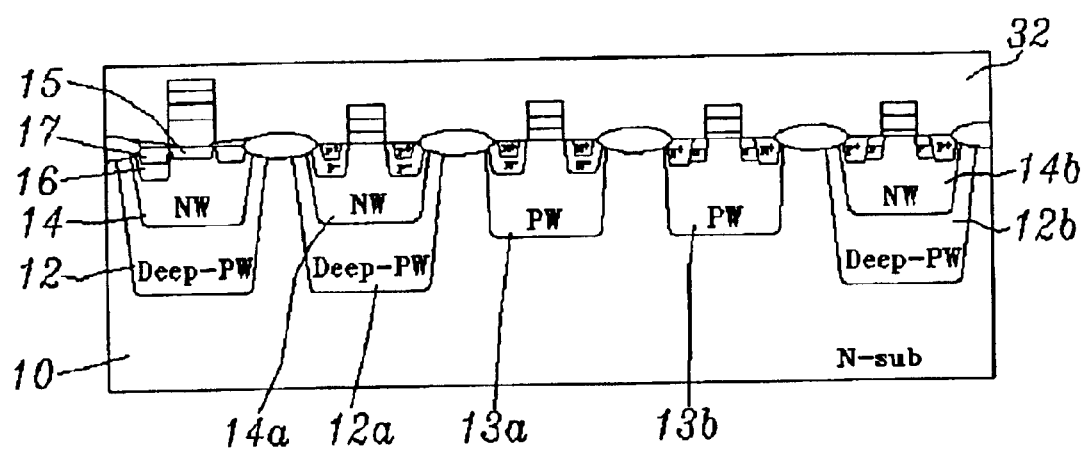
Figure 1V:
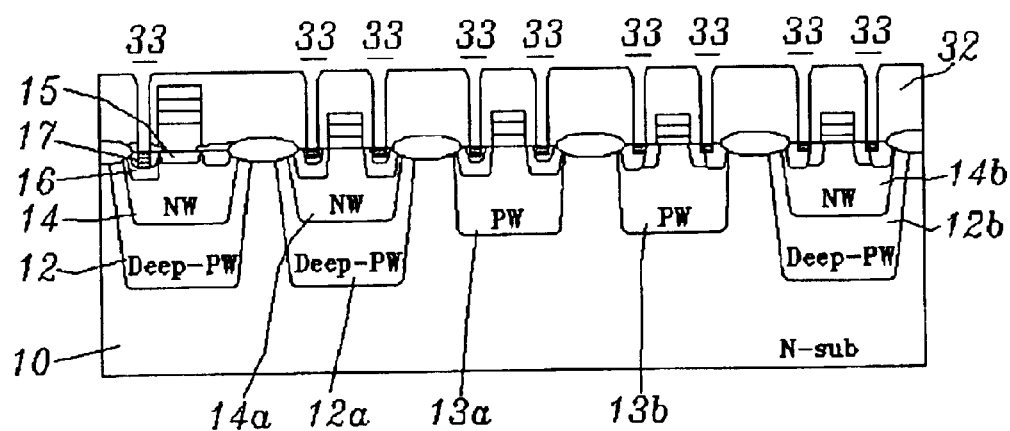
Figure 1W:
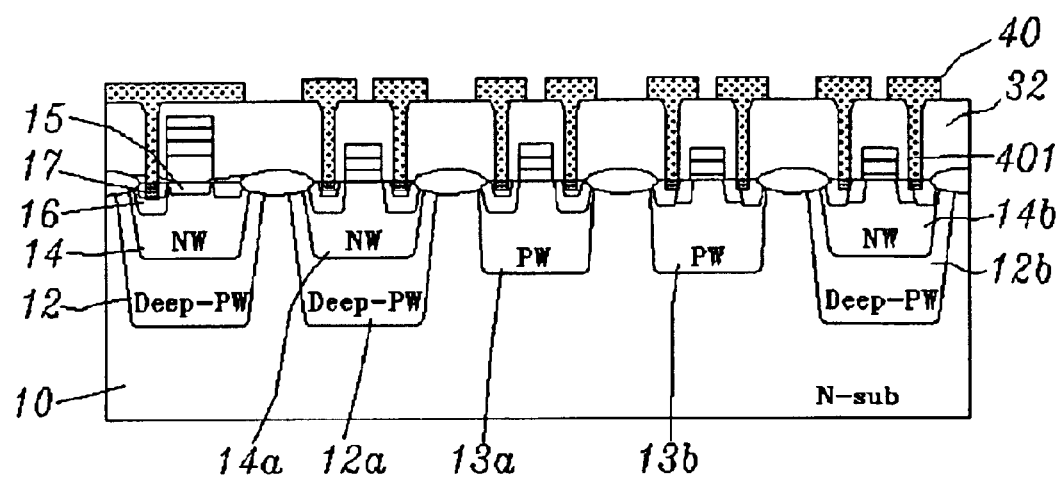
Figure 1X:
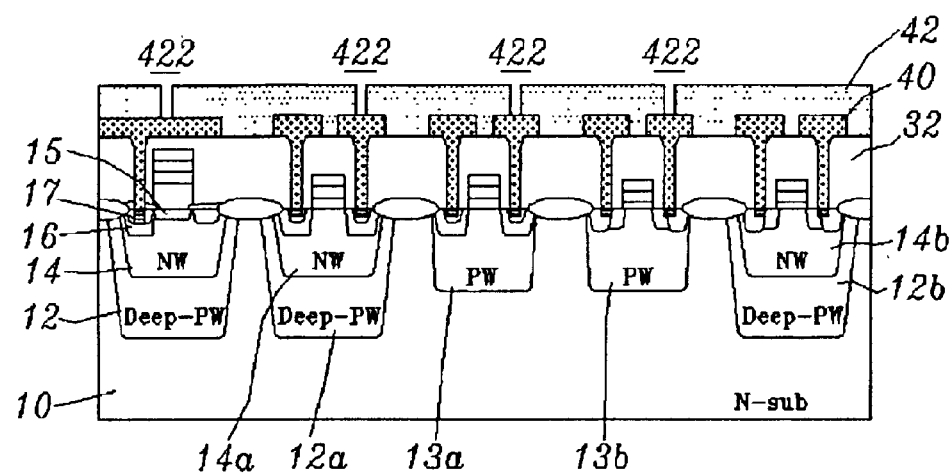
Figure 1Y:
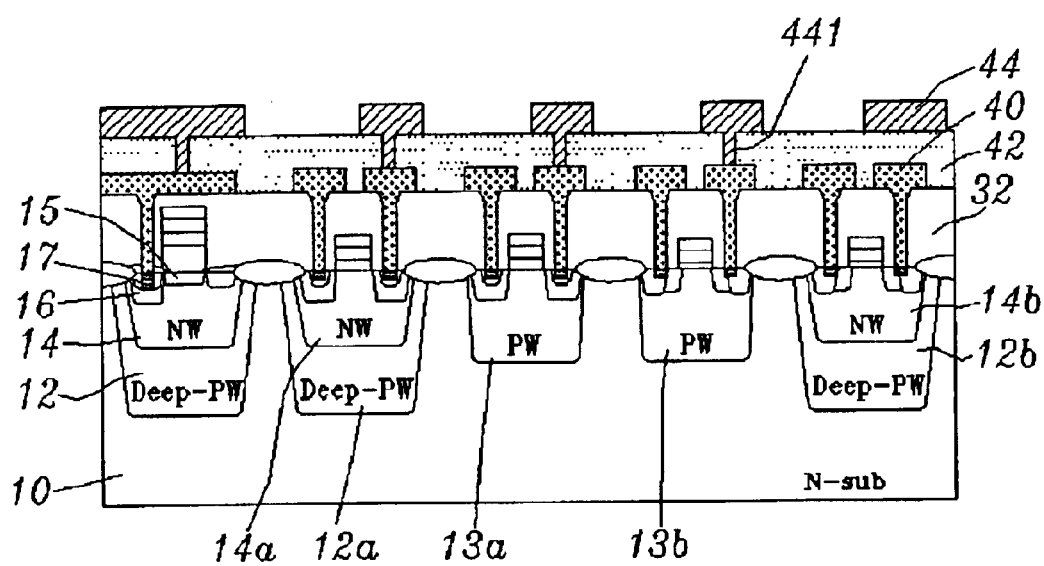
Figure 1Z:
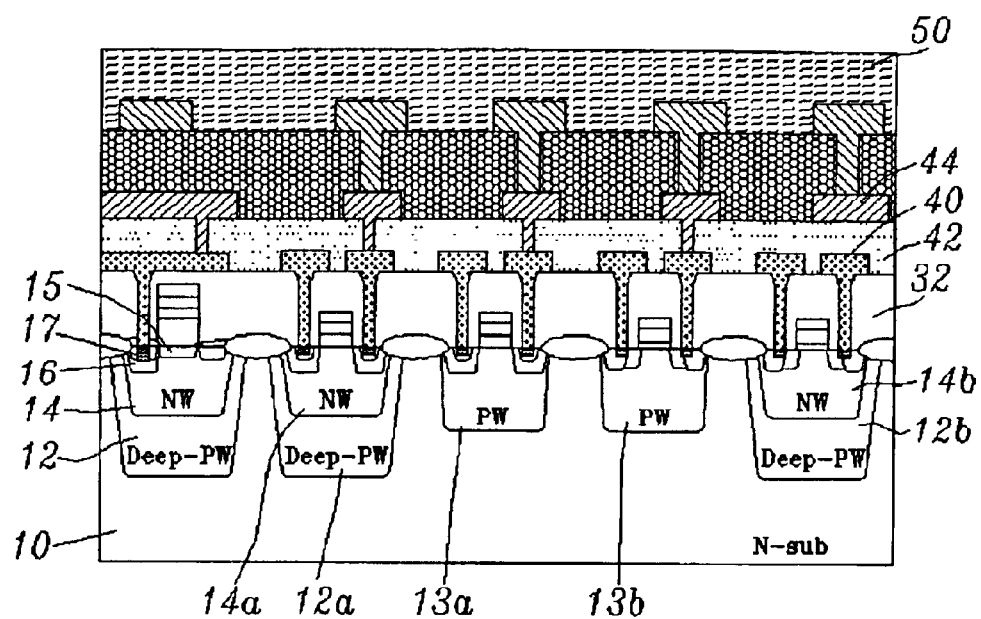
Figure 2:
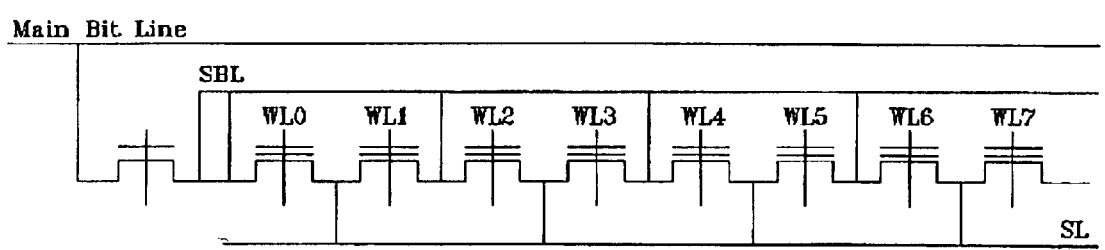
FIG. 2 is a circuit diagram according to a preferred embodiment of the present invention.

Please refer to FIGS. 1A to 1Z, which show the process flow according to a preferred embodiment of the present invention. The process flow comprises the following steps:

Step A

A deep P-well 12 of the flash memory cell, a first deep P-well 12a of the CMOS device, and a second deep P-well 12b of the CMOS device are implanted in proper positions of an N-substrate 10, as shown in FIG. 1A;

Step B

An N-well 14 is implanted in the deep P-well 12 of flash memory cell, a first N-well 14a is implanted in the first deep P-well 12a of the CMOS device, and a second N-well 14b is implanted in the second deep P-well 12b of the CMOS device, as shown in FIG. 1B;

Step C

A first P-well 13a and a second P-well 13b are implanted between the first deep P-well 12a and the second deep P-well 12b of the CMOS device in the N-substrate 10, as shown in FIG. 1C;

Step D

A shallow p-type region 15 is implanted on the surface of the N-well 14 in the deep P-well of the flash memory cell, as shown in FIG. 1D;

Step E

A tunnel oxide layer 20 is grown on the substrate 10, and a first polysilicon layer 22 is deposited, as shown in FIG. 1E;

Step F

The tunnel oxide layer 20 and the first polysilicon layer 22 on the CMOS device are etched, as shown in FIG. 1F;

Step G

An oxide-nitride-oxide (ONO) film 24 is deposited on the first polysilicon layer 22, and the ONO film 24 on the CMOS device is etched, as shown in FIG. 1G;

Step H

A thick oxide layer 25 is grown on the CMOS device, and the thick oxide layer 25 on the second N-well 14b and the second P-well 13b are locally etched, as shown in FIG. 1H;

Step I

A thin oxide layer 26 is grown on the second N-well 14b and the second P-well 13b of the CMOS device, as shown in FIG. 1I;

Step J

A second polysilicon layer 27 and a tungsten silicide 28 are deposited, as shown in FIG. 1J;

Step K

The tunnel oxide layer 20 and all grown and deposited layers on the flash memory cell are etched to form a rectangular stacked layer 30, whose two sides being exposed region of the tunnel oxide layer, and oxidation is performed to form a smiling effect oxide 21 between the rectangular stacked layer 30 and the N-well 14, as shown in FIG. 1K;

Step L

A deep p-type region 16 is implanted at one side of the rectangular stacked layer 30 in the flash memory cell and in the N-well 14, as shown in FIG. 1L;

Step M

N-type regions 17 and 18 are implanted at two sides of the rectangular stacked layer 30 in the flash memory cell, respectively, and in the N-well 14, as shown in FIG. 1M;

Step N

All grown and deposited layers on the CMOS device are etched to respectively form stacked layers 30a, 30b, 30c, and 30d, as shown in FIG. 1N;

Step O

A first lightly doped n-type region 130b is implanted at two sides of the stacked layer 30c on the second P-well 13b of the CMOS device, as shown in FIG. 1O;

Step P

A first lightly doped p-type region 140b is implanted at two sides of the stacked layer 30d on the second N-well 14b of the CMOS device, as shown in FIG. 1P;

Step Q

A second lightly doped n-type region 130a is implanted at two sides of the stacked layer 30b on the second P-well 13a of the CMOS device, as shown in FIG. 1Q;

Step R

A second lightly doped p-type region 140a is implanted at two sides of the stacked layer 30a on the second N-well 14a of the CMOS device, as shown in FIG. 1R;

Step S

An insulating layer is deposited, and side wall spacers 120a and 120b are etched out, a higher doped n-type region 131b is implanted at two sides of the stacked layer 30b on the first P-well 13a of the CMOS device, and a higher doped n-type region 131a is implanted at two sides of the stacked layer 30c on the second P-well 13b of the CMOS device, as shown in FIG. 1S;

Step T

A higher doped p-type region 141b is implanted at two sides of the stacked layer 30a on the first N-well 14a of the CMOS device, and a higher doped p-type region 141a is implanted at two sides of the stacked layer 30d on the second N-well 14b of the CMOS device, as shown in FIG. 1T;

Step U

An insulating layer 32 is formed to cover the rectangular stacked layer 30 and the stacked layers 30a, 30b, 30c, and 30d on the substrate 10, as shown in FIG. 1U;

Step V

Contact holes 33 are etched out at one side of the rectangular stacked layer 30 and two sides of the stacked layers 30a, 30b, 30c, and 30d on the substrate 10 to expose part of the implanted regions. Silicide 34 is deposited in the implanted regions below the contact holes 33. The implanted regions in part of the N-well and P-well deepened to prevent the deposited silicide 34 from penetrating the junctions, as shown in FIG. 1V;

Step W

A first metal layer 40 is deposited on the insulating layer 32 and locally etched so that each of the contact holes has a first metal interconnect 401 therein, as shown in FIG. 1W;

Step X

A first dielectric layer 42 is deposited on the first metal layer 40, and a plurality of contact vias 422 are etched out, as shown in FIG. 1X;

Step Y

A second metal layer 44 is formed on the first dielectric layer 42 and locally etched so that each of the contact vias 422 has a second metal interconnect 441, as shown in FIG. 1Y; and Step Z Steps X and Y are repeated till the required level. An encapsulation 50 is finally deposited to cover on the metal layer, as shown in FIG. 1Z.

It is noted that the present invention has low-voltage CMOS devices and high-voltage CMOS devices. The low-voltage CMOS devices are mainly used in logical controllers and encoders, and the high-voltage CMOS devices are mainly used in high-voltage switches, word-line drivers. Therefore, the low-voltage CMOS devices need to meet the requirement of high-speed operation, and the high-voltage CMOS devices need to be capable of bearing a higher breakage voltage. The operating mode of the flash memory cell is shown in Table 1. If the reading operation is performed, the word line voltage is 3.3 V, the bit line voltage is 0V, and the source line voltage is 1 V.

TABLE 1

|  | Word line voltage | Bit line voltage | Source line voltage |
| --- | --- | --- | --- |
| Program | −10 V | 5 V | Floating |
| Erase | 10 V | Floating | −8 V |
| Read | 3.3 V | 0 V | 1 V |

To sum up, the present invention relates to a structure of an embedded channel write/erase flash memory cell and a fabricating method thereof and, more particularly, to a structure combining CMOS devices and flash memory cells, which can not only effectively improve the operating efficiency of flash memory cells and CMOS devices, but its whole volume is also smaller than that obtained by combining separately designed and fabricated CMOS devices and flash memory cells.

Although the present invention has been described with reference to the preferred embodiment thereof, it will be understood that the invention is not limited to the details thereof. Various substitutions and modifications have been suggested in the foregoing description, and other will occur to those of ordinary skill in the art. P-type semiconductors and n-type semiconductors can interchange each other in the structure of the present invention. For instance, the N-well/ deep P-well/N-substrate structure can be replaced with the P-well/deep N-well/ P-substrate structure. Therefore, all such substitutions and modifications are intended to be embraced within the scope of the invention as defined in the appended claims.

What is claimed is:

1. A structure of an embedded channel write/erase flash memory cell, comprising mainly:
    an N-substrate;
    a flash memory cell region comprising mainly:
        a deep P-well formed in said substrate;
        N-well formed in said deep P-well, a deep p-type region and a shallow p-type region being implanted in predetermined positions of said N-well;
        a first n-type region formed at one side of said shallow p-type region and in said deep p-type region in said N-well to be used as a drain;
        a second n-type region formed at the other side of said shallow p-type region in said N-well to be used as a source; and
        a stacked gate formed on said N-well; and
    a CMOS device region comprising mainly:
        a first deep P-well formed in said substrate;
        a first N-well formed in said first deep P-well, a plurality of p-type regions being implanted in predetermined positions of said first N-well;
        a second deep P-well formed in said substrate; and
        a second N-well formed in said second deep P-well, a plurality of p-type regions being implanted in predetermined positions of said second N-well.

2. The structure of an embedded channel write/erase flash memory cell as claimed in claim 1, wherein an oxide layer is further provided between said N-well and said stacked gate of said flash memory cell region.

3. The structure of an embedded channel write/erase flash memory cell as claimed in claim 2, wherein a smiling effect pattern is caused by oxidation between said stacked gate and said oxide layer.

4. The structure of an embedded channel write/erase flash memory cell as claimed in claim 1, wherein the implanted depth of said deep p-type region in said N-well of said flash memory cell region is larger than that of said shallow p-type region.

5. The structure of an embedded channel write/erase flash memory cell as claimed in claim 1, wherein said deep p-type region in said N-well of said flash memory cell region is connected with one end of said shallow p-type region.

6. The structure of an embedded channel write/erase flash memory cell as claimed in claim 1, wherein a field oxide layer and an n-type ion channel barrier layer can also be provided between said second n-type region and said shallow p-type region in said N-well, said n-type ion channel barrier layer being disposed below said field oxide layer.

7. The structure of an embedded channel write/erase flash memory cell as claimed in claim 1, wherein said first n-type region implanted in said deep p-type region of said flash memory cell region is connected to said deep p-type region via an electrical short circuit.

8. The structure of an embedded channel write/erase flash memory cell as claimed in claim 7, wherein said electrical short circuit is formed by using a metal contact to penetrate a junction between said first n-type region in said deep p-type region and said deep p-type region.

9. The structure of an embedded channel write/erase flash memory cell as claimed in claim 7, wherein said electrical short circuit is formed by using a metal contact to connect said exposed first n-type region in said deep p-type region with said deep p-type region.

10. The structure of an embedded channel write/erase flash memory cell as claimed in claim 1, wherein said CMOS device region further comprises a first P-well formed in said substrate and at one side of said first deep P-well.

11. The structure of an embedded channel write/erase flash memory cell as claimed in claim 10, wherein said CMOS device region further comprises a second P-well formed on said substrate and at one side of said first P-well.

12. The structure of an embedded channel write/erase flash memory cell as claimed in claim 1, wherein said CMOS device region further comprises a first P-well formed in said first deep P-well.

13. The structure of an embedded channel write/erase flash memory cell as claimed in claim 1, wherein said CMOS device region further comprises a second P-well formed in said second deep P-well.

* * * * *